(12) United States Patent  (10) Patent No.: US 12,660,511 B2
van der Straten et al.  (45) Date of Patent: Jun. 16, 2026

(54) MRAM ANCHOR VIA

(71) Applicant: International Business Machines Corporation, Armonk, NY (US)

(72) Inventors: Oscar van der Straten, Guilderland Center, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 362 days.

(21) Appl. No.: 18/352,652

(22) Filed: Jul. 14, 2023

(65) Prior Publication Data

US 2025/0024757 A1    Jan. 16, 2025

(51) Int. Cl.
H10N 50/80      (2023.01)
H10B 61/00      (2023.01)
H10N 50/01      (2023.01)
H10N 50/20      (2023.01)

(52) U.S. Cl.
CPC ............. H10N 50/80 (2023.02); H10B 61/00 (2023.02); H10N 50/01 (2023.02); H10N 50/20 (2023.02)

(58) Field of Classification Search
CPC ........ H10N 50/80; H10N 50/85; H10N 50/01; H10B 61/00–22; G11C 11/14–1697; G11C 11/5607; G11C 14/0036; G11C 14/0045; G11C 14/0081; G11C 19/02–10; G11C 19/14; G11C 2211/5615–5616
See application file for complete search history.

(56) References Cited

U.S. PATENT DOCUMENTS

| | | | |
|---|---|---|---|
| 9,502,640 | B1 | 11/2016 | Annunziata et al. |
| 9,559,294 | B2 | 1/2017 | Hsu et al. |
| 9,564,577 | B1 | 2/2017 | Hsu et al. |
| 11,239,413 | B2 | 2/2022 | Lin et al. |
| 11,495,743 | B2 | 11/2022 | Hsu et al. |
| 2009/0209050 | A1 | 8/2009 | Wang et al. |
| 2010/0240189 | A1* | 9/2010 | Jeong ....................... H10D 1/47 |
| | | | 438/653 |
| 2011/0049655 | A1 | 3/2011 | Assefa et al. |
| 2017/0194378 | A1* | 7/2017 | Kim ..................... H10N 70/253 |
| 2018/0158728 | A1* | 6/2018 | Chu ..................... H10N 70/841 |
| 2019/0027537 | A1* | 1/2019 | Wiegand ........... H01L 23/53238 |
| 2019/0067559 | A1* | 2/2019 | Chang .................... H10N 50/10 |
| 2020/0144498 | A1* | 5/2020 | Yang ...................... H10N 50/10 |
| 2020/0152864 | A1* | 5/2020 | Wu ......................... H10B 61/22 |
| 2020/0321394 | A1* | 10/2020 | Hashemi ................ H10B 61/10 |
| 2020/0350494 | A1* | 11/2020 | Dutta ................... H10D 86/421 |
| 2021/0233812 | A1* | 7/2021 | Reznicek .......... H01L 21/76883 |
| 2022/0059759 | A1* | 2/2022 | Shen ...................... H10B 61/00 |
| 2022/0359815 | A1* | 11/2022 | Ku ......................... H10N 50/80 |
| 2023/0016126 | A1* | 1/2023 | Lee ........................ H10B 61/00 |
| 2023/0074676 | A1 | 3/2023 | Frougier et al. |

(Continued)

FOREIGN PATENT DOCUMENTS

KR        20190049180 A  *  5/2019  ........ H01L 23/5386

*Primary Examiner* — Scott B Geyer

(74) *Attorney, Agent, or Firm* — Harrity & Harrity, LLP

(57)        ABSTRACT

A magnetoresistive random access memory (MRAM) includes a first conductor and a magnetic tunnel junction (MTJ) having a bottom electrode. An anchor via connects the first conductor to the bottom electrode. The anchor via includes a via conductor encapsulated within a diffusion barrier. The diffusion barrier includes a conductive cap disposed between the via conductor and the bottom electrode.

6 Claims, 10 Drawing Sheets

(56)          References Cited

U.S. PATENT DOCUMENTS

2023/0154513 A1*   5/2023  Hashemi ................ H10N 50/85
                                                    365/158
2023/0200086 A1*   6/2023  van der Straten ..... H10B 61/00
                                                    257/421
2023/0238318 A1*   7/2023  Guan ................ H01L 21/76843
                                                    257/421
2023/0354717 A1*  11/2023  Lee ........................ H10B 61/22
2023/0413682 A1*  12/2023  Lin ........................ H10B 61/00

* cited by examiner

MRAM ANCHOR VIA

BACKGROUND

The present invention generally relates to magnetic memory devices, and more particularly to a magnetic memory device having an anchor via that reduces tunneling barrier shorts.

For high performance magnetoresistive random access memory (MRAM) devices based on perpendicular magnetic tunnel junction (MTJ) structures, well-defined interfaces and interface control are important considerations. MTJ structures typically include a bottom electrode, a Co-based synthetic anti-ferromagnet (SAF), a CoFeB-based reference layer, a MgO-based tunnel barrier, a CoFeB-based free layer and cap layers containing, e.g., Ta and/or Ru. Embedded MTJ structures are usually formed by patterning blanket MTJ layer stacks.

Reactive ion etch (RIE), and ion beam etch (IBE) processing of such MTJ stacks presents a major challenge, as it can lead to shorts due to substrate gouging and metal re-sputtering of metal layers onto MTJ stack sidewalls. As the sidewalls of the MTJ stack are defined, the etching of nearby bottom electrodes can redeposit metal on these sidewalls. In addition, the substrate or material around the neighboring bottom electrode can be gouged by the RIE process. Substrate gouging and metal resputtering leads to shorts, defects, and decreased performance.

SUMMARY

In accordance with an embodiment of the present invention, a magnetoresistive random access memory (MRAM) includes a first conductor and a magnetic tunnel junction (MTJ) having a bottom electrode. An anchor via connects the first conductor to the bottom electrode. The anchor via includes a via conductor encapsulated within a diffusion barrier. The diffusion barrier includes a conductive cap disposed between the via conductor and the bottom electrode.

In accordance with another embodiment, a method for making a MRAM includes forming a dielectric cap layer over a first conductor and a first interlevel dielectric layer; etching an anchor via hole through a second interlevel dielectric layer formed on the dielectric cap layer and through the dielectric cap layer to expose the first conductor. A first diffusion barrier is deposited in the anchor via hole, and a second diffusion barrier is deposited over the first diffusion barrier. A conformal conductive deposition is performed to partially fill and narrow the anchor via hole. A selective etch recesses the second diffusion barrier and the conformal conductive deposition such that a portion of the second diffusion barrier and a portion of the conformal conductive deposition remain in a bottom portion of the anchor via hole. An anchor via conductor is formed in the anchor via hole and a cap is formed to encapsulate the anchor via conductor with the first diffusion barrier and the cap. Magnetic tunnel junction layers are formed and etched to form a magnetic tunnel junction stack. The magnetic tunnel junction stack is wider than the anchor via wherein regions laterally adjacent to the anchor via are free of conductive materials. Regions adjacent to the anchor via and between the magnetic tunnel junction stack and a dielectric cap layer are free from metal structures.

In accordance with another embodiment, a method for making a MRAM includes forming a first conductor in a first interlevel dielectric layer; forming a dielectric cap layer over the first conductor and the first interlevel dielectric layer; depositing a second interlevel dielectric layer on the dielectric cap layer; etching an anchor via hole through the second interlevel dielectric layer on the dielectric cap layer to expose the first conductor; depositing a first diffusion barrier in the anchor via hole; depositing a second diffusion barrier over the first diffusion barrier; performing a conformal conductive deposition to partially fill and narrow the anchor via hole; selectively etching to recess the second diffusion barrier and the conformal conductive deposition such that a portion of the second diffusion barrier and a portion of the conformal conductive deposition remain in a bottom portion of the anchor via hole; depositing a conductive fill; recessing the conductive fill into the anchor via hole to from a recess; forming a cap in the recess to fully encapsulate an anchor via conductor with the first diffusion barrier and the cap; forming magnetic tunnel junction layers; etching the magnetic tunnel junction layers to form a magnetic tunnel junction stack, the magnetic tunnel junction stack being wider than the anchor via wherein regions laterally adjacent to the anchor via are free of conductive materials; and forming sidewall spacers on sides of the magnetic tunnel junction stack.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
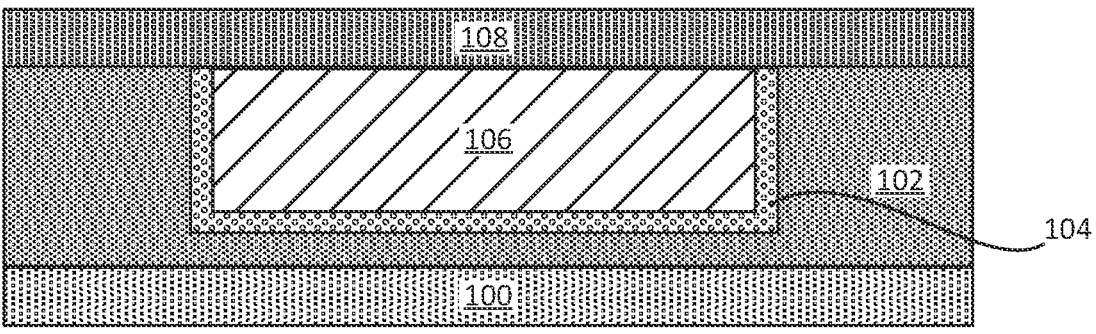
FIG. 1 is a cross-sectional view showing a cap dielectric layer formed on a conductor in accordance with an embodiment of the present invention.

Embodiments of the present invention include magnetic devices having an anchor via that contributes to the reduction or elimination of tunnel barrier shorts. In one embodiment, the magnetic device includes a magnetoresistive random-access memory (MRAM) device. The MRAM device or cell can include an anchor via at its base. The anchor via includes a structure that provides the conductivity needed to connect to the MRAM device for proper operation with additional features that reduce the risk of shorts on sidewalls of a magnetic tunnel junction (MTJ) stack.

The anchor via can be formed by employing a deposition of one or more metal barriers. One barrier will form a partially recessed inner barrier and the other along with a metal cap and the inner barrier will form an enclosed or encapsulated region. The enclosed region will be filled with a via conductor (e.g., a metal, such as e.g., tungsten (W), molybdenum (Mo), ruthenium (Ru)) prior to the formation of the metal cap. The enclosed or encapsulated region surrounds the via conductor with a diffusion barrier that reduces the risk of metal materials negatively impacting the MTJ stack. In addition, the via conductor preferably includes a metal that exhibits less likelihood of diffusion, redistribution, or the formation of voids after thermal budgets. For example, copper (Cu) can be avoided. Magnetic metals (such as, e.g., Cobalt (Co)) should also be avoided due to their interference with magnetic tunnel junction (MTJ) stacks.

The anchor via has a narrower width than the MTJ stack. Further, the structure in accordance with embodiments of the present invention avoids a metal structure laterally adjacent to the anchor via or even the MTJ stack. Exposure of bottom electrodes of nearby devices which could lead to resputtering of metals is avoided by using the anchor via and making regions thereabout free from metal conductive structures. In accordance with embodiments of the present invention, bottom electrodes are made thinner and do not extend deeper into the dielectric layers surrounding the MTJ stack. There is little chance for metal resputtering as a result of the manner in which the device is fabricated.

The anchor via is formed to have a complete outer metal barrier (e.g., including TaN), while having a partially recessed or etched inner metal barrier (e.g., including TiN).

In one embodiment, conformal metal deposition and metal etch cycles are employed to form the anchor via in stages to enable seamless and void-free anchor via metallization formation. In this way, a number of processing flaws associated with recessing a via are avoided. These flaws could include non-uniformities, sidewall damage, voids, etc. The resulting structure exhibits no tunnel barrier shorts since no bottom electrode metal re-sputtering can occur during MRAM stack patterning.

Exemplary applications/uses to which the present invention can be applied include, but are not limited to semiconductor devices. Semiconductor devices can include processors, memory devices, application specific integrated circuits (ASICs), logic circuits or devices, combinations of these and any other circuit device. In such devices, one or more semiconductor devices can be included in a central processing unit, a graphics processing unit, and/or a separate processor- or computing element-based controller (e.g., logic gates, etc.). The semiconductor devices can include one or more on-board memories (e.g., caches, dedicated memory arrays, read only memory, etc.). In some embodiments, the semiconductor devices can include one or more memories that can be on or off board or that can be dedicated for use by a hardware processor subsystem (e.g., ROM, RAM, basic input/output system (BIOS), etc.).

In some embodiments, the semiconductor devices can include and execute one or more software elements. The one or more software elements can include an operating system and/or one or more applications and/or specific code to achieve a specified result. In still other embodiments, the semiconductor devices can include dedicated, specialized circuitry that perform one or more electronic processing functions to achieve a specified result. Such circuitry can include one or more field programmable gate arrays (FPGAs), and/or programmable applications programmable logic arrays (PLAs).

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising." "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, methods for manufacturing a magnetoresistive random access memory (MRAM) cell is shown in accordance with embodiments of the present invention. The MRAM cell includes a substrate 100 having multiple layers on which the MRAM cell will be fabricated. The substrate 100 can include any suitable substrate structure, e.g., a bulk semiconductor, a semiconductor-on-insulator (SOI) substrate, etc. In one example, the substrate 100 can include a silicon-containing material. Illustrative examples of Si-containing materials suitable for the substrate 100 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

While the substrate 100 can include a single semiconductor layer, the substrate 100 can also be comprised of a plurality of different layers including one or more front end of line (FEOL) layers, one or more middle of the line layers (MOL) and/or one more back end of line (BEOL) layers. These layers may include turn include one or more active device layers, one or more dielectric layers, one or more metal layers, etc.

A dielectric layer 102, such as, e.g., an interlevel dielectric layer (ILD) is formed on the substrate 100. The dielectric layer 102 can include any suitable material, e.g., selected from the group consisting of silicon containing materials such as $SiO_2$, $Si_3N_4$, $SiO_xN_y$, SiC, SiCO, SiCOH, and SiCH compounds, the above-mentioned silicon containing materials with some or all of the Si replaced by Ge, carbon doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC), also known as amorphous hydrogenated carbon, α-C:H). The dielectric layer 102 can be deposited using chemical vapor deposition (CVD), although other deposition methods can be employed.

The deposited dielectric layer 102 is then patterned and etched to form a hole or trench. The trench is then lined with a diffusion barrier or metal liner 104. The diffusion barrier 104 can be conformally deposited over the topography of the dielectric layer 102. The diffusion barrier 104 can be deposited by an atomic layer deposition (ALD) process, physical vapor deposition (PVD) or a CVD process, although other processes may be employed. The diffusion barrier 104 can include a material such as, e.g., TiN, TaN, TiWN, TaWN or the like.

A conductive fill is performed to fill the trenches on top of the diffusion barrier 104. The conductive fill can include materials, such as, e.g., Cu, Ru, Mo, Rh, W, Ir, and alloys or combinations of these and other conductive materials. In a particularly useful embodiment, the conductive fill includes Ru. The conductive fill can be formed using a deposition method, such as, e.g., CVD, plasma enhanced CVD (PECVD), ALD or any other suitable deposition method.

A planarization process is performed, e.g., a chemical mechanical polish (CMP) to reduce the conductive fill to a surface of the dielectric layer 102 to form conductor 106. This CMP process also removes the diffusion barrier 104 from the surface of the dielectric layer 102. The conductor 106 can include a metal line, a via or any other suitable conductive structure. The conductor 106 form an electrode for the MRAM cell to be fabricated.

A dielectric cap layer 108 is deposited over the conductor 106 and dielectric layer 102. The dielectric cap layer 108 preferably includes a material that is selectively removeable relative to the dielectric layer 102, While the same materials and process used for the layer 102 can be employed for layer 108, layer 108 includes a different chemistry to enable the selectivity. For example, if dielectric layer 102 includes a silicon oxide, cap layer 108 can include a silicon nitride. The dielectric cap layer 108 includes a reduced thickness relative to the dielectric layer 102. For example, dielectric cap layer 108 is thick enough to protect the top portion of the conductor 106 during subsequent processing.

Figure 2:
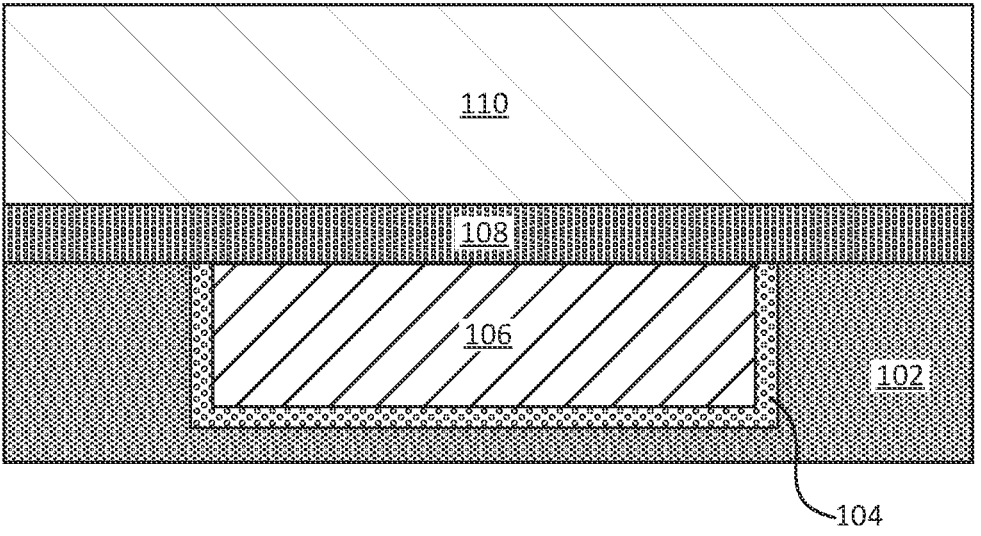
FIG. 2 is a cross-sectional view showing an interlevel dielectric layer formed on the cap dielectric layer in accordance with an embodiment of the present invention.

Referring to FIG. 2, another dielectric layer 110 is formed on the dielectric layer 108. The dielectric layer 110 can be formed is a similar manner and of similar composition as dielectric layer 102.

Figure 3:
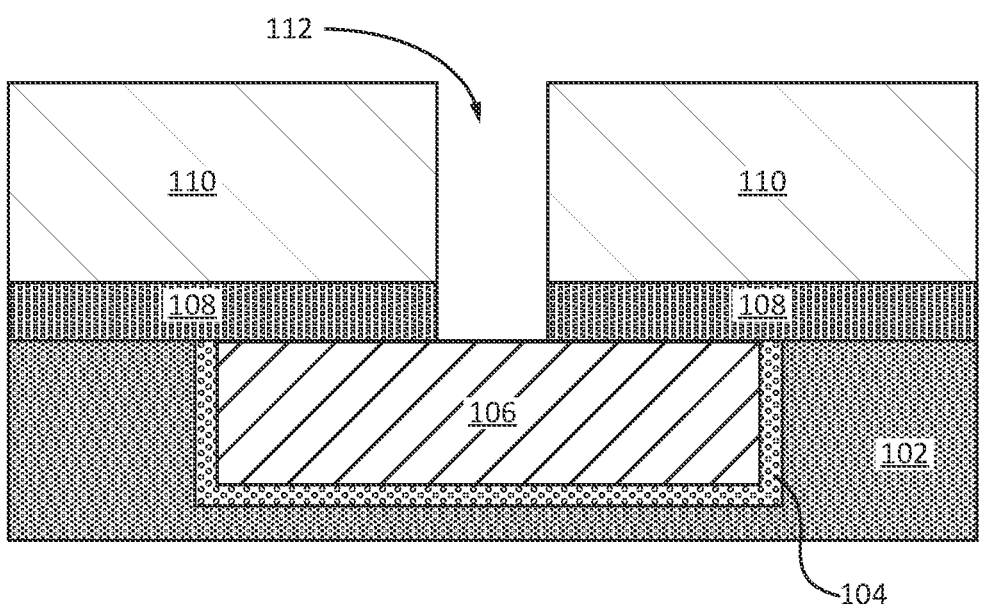
FIG. 3 is a cross-sectional view showing an anchor via hole formed through the interlevel dielectric layer and the cap dielectric layer in accordance with an embodiment of the present invention.

Referring to FIG. 3, the deposited dielectric layer 110 is then patterned and etched to form an anchor via hole 112 in accordance with one embodiment. The patterning can include the formation of a hard mask, followed by lithographic processing to produce and etch pattern. The etch process can include a reactive ion etch (RIE) process that stops on the conductor 106. The anchor via hole 112 may be centered over a width of the conductor 106.

Figure 4:
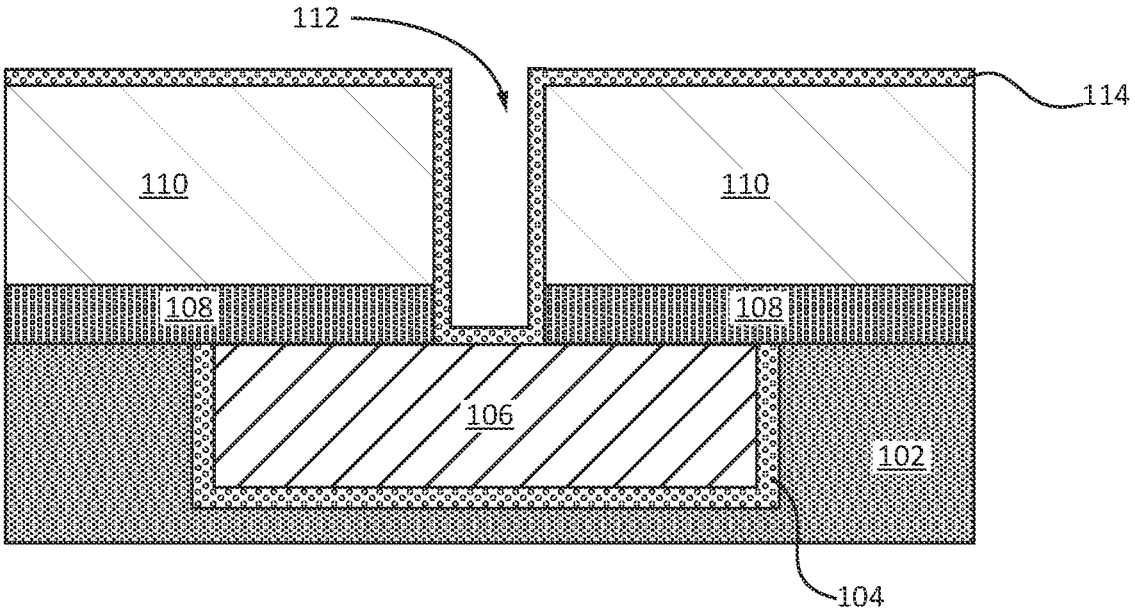
FIG. 4 is a cross-sectional view showing a first diffusion barrier formed in the anchor via hole in accordance with an embodiment of the present invention.

Referring to FIG. 4, the anchor via hole 112 is then lined with a first anchor via diffusion barrier or metal liner 114. The diffusion barrier 114 can be conformally deposited over the topography of the dielectric layers 108 (in the anchor via hole 112) and dielectric layer 110. The diffusion barrier 104 can be deposited by an ALD process, PVD process or a CVD process, although other processes may be employed. The diffusion barrier 114 can include a material such as, e.g., TiN, TaN, TiWN, TaWN, HfN or the like, although in accordance with particularly useful embodiments TaN can be employed for diffusion barrier 114.

Figure 5:
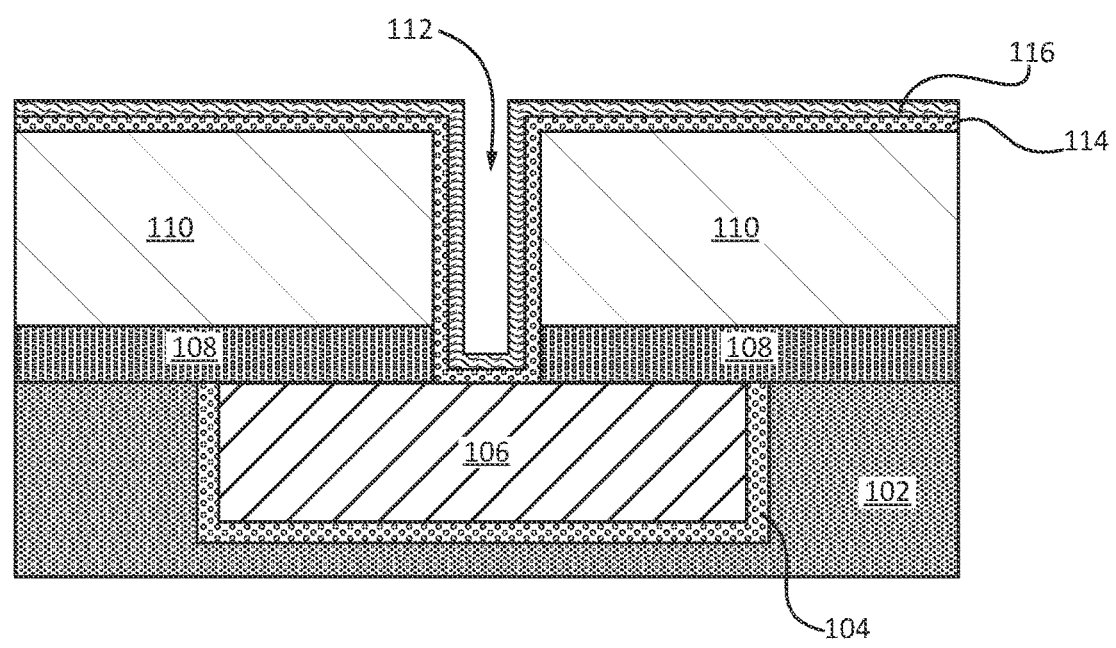
FIG. 5 is a cross-sectional view showing a second diffusion barrier formed on the first diffusion barrier in anchor via hole in accordance with an embodiment of the present invention.

Referring to FIG. 5, the anchor via hole 112 is then lined with a second anchor via diffusion barrier or metal liner 116. The diffusion barrier 116 can be conformally deposited over the topography of the first anchor via diffusion barrier 114. The diffusion barrier 116 can be deposited by an ALD process, PVD process or a CVD process, although other processes may be employed. The diffusion barrier 116 can include a material such as, e.g., TiN, TaN, TiWN, TaWN, HfN or the like, although in accordance with particularly useful embodiments TiN can be employed for diffusion barrier 116.

Materials for the first anchor via diffusion barrier 114 and second anchor via diffusion barrier 116 should be selected to provide etch selectivity relative to one another. The etch selectivity will be employed as described herein.

Figure 6:
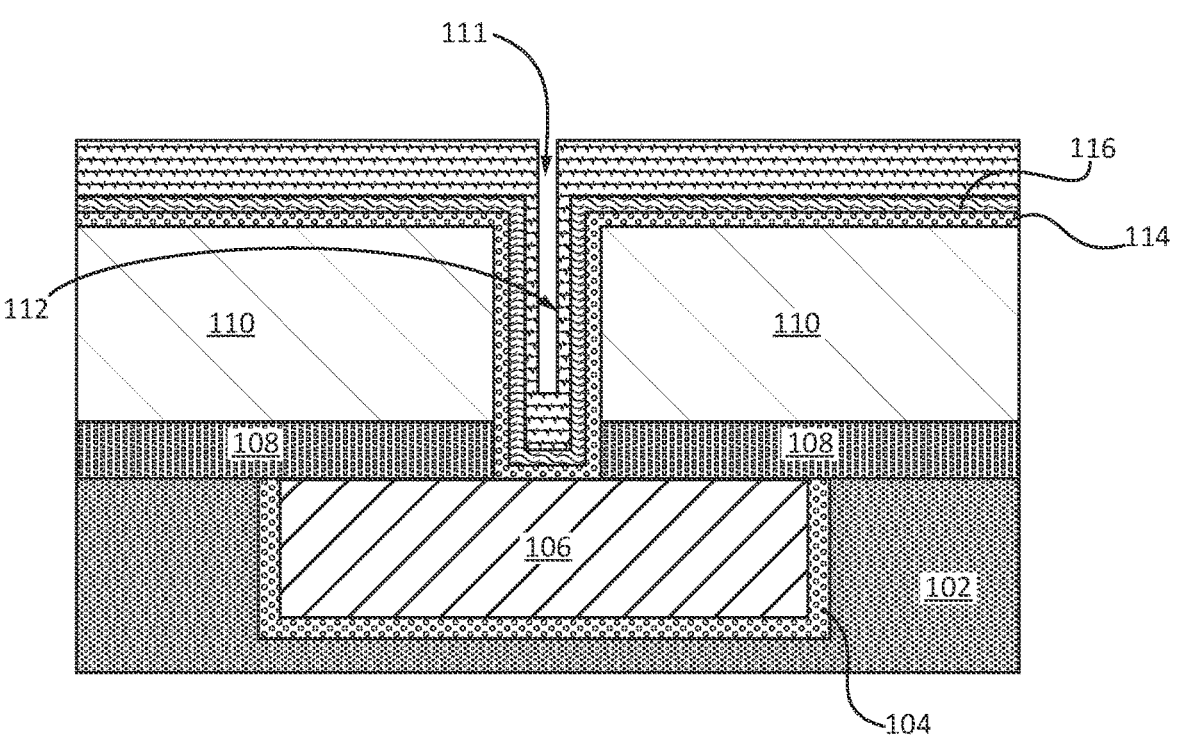
FIG. 6 is a cross-sectional view showing a conformal conductive deposition partially filling and narrowing the anchor via hole without pinching off due to growth of the conformal conductive deposition within the anchor via hole such that a center portion remains open in accordance with an embodiment of the present invention.

Referring to FIG. 6, a conformal conductive deposition 118 is performed to further fill the anchor via hole 112 over the diffusion barrier 116 and 114. The conductive deposition 118 can include materials, such as, e.g., W, Mo, Ru and alloys or combinations of these and other conductive materials. In a particularly useful embodiment, the conductive deposition 118 includes W. The conductive deposition 118 can be formed using a deposition method, such as, e.g., CVD, PECVD, ALD or any other suitable conformal deposition method. The conductive deposition 118 builds up on surfaces to begin to reduce the overall size of a space 111 within the anchor via hole 112.

In one embodiment, a void-free construction with no center seam is realized by employing CVD deposition and carefully controlling growth to prevent pinching off (pinch off) of the anchor via hole 112 due to growth of the conformal conductive deposition 118. The center seam and voids can be avoided by employing the conformal metal deposition such that no metal is allowed to close off the center of the anchor via hole 112. This can include multiple deposition and etching cycles to gradually build up the conductive material without pinching off the anchor via hole 112. In useful embodiments, at least two deposition cycles are employed.

Figure 7:
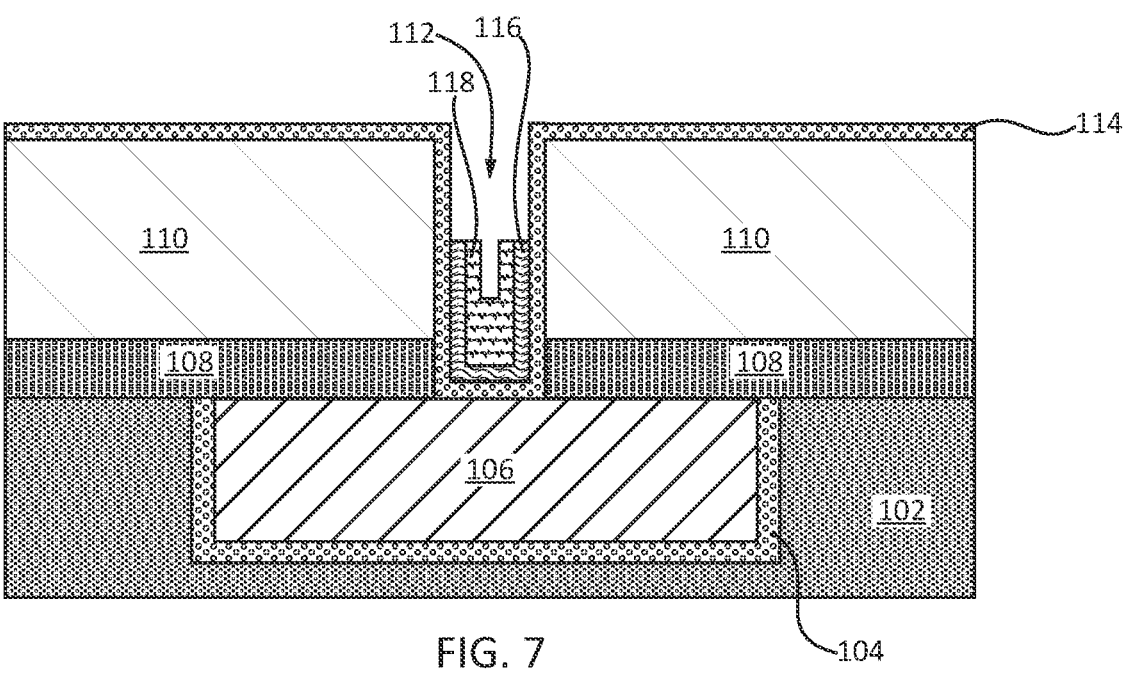
FIG. 7 is a cross-sectional view showing the conformal conductive deposition and the second diffusion barrier recessed into the anchor via hole in accordance with an embodiment of the present invention.

Referring to FIG. 7, a selective etch process is performed to remove portions of the conductive deposition 118 and the second anchor via diffusion barrier 116. The selective etch can include a dry or wet etch that selectively removes the conductive deposition 118 and the second anchor via diffusion barrier 116 from a top surface and recesses the conductive deposition 118 and the second anchor via diffusion barrier 116 within the anchor via hole 112. A top surface of the second anchor via diffusion barrier 116 in the anchor via hole 112 preferably remains above an interface of dielectric layer 109 and dielectric layer 110.

Figure 8:
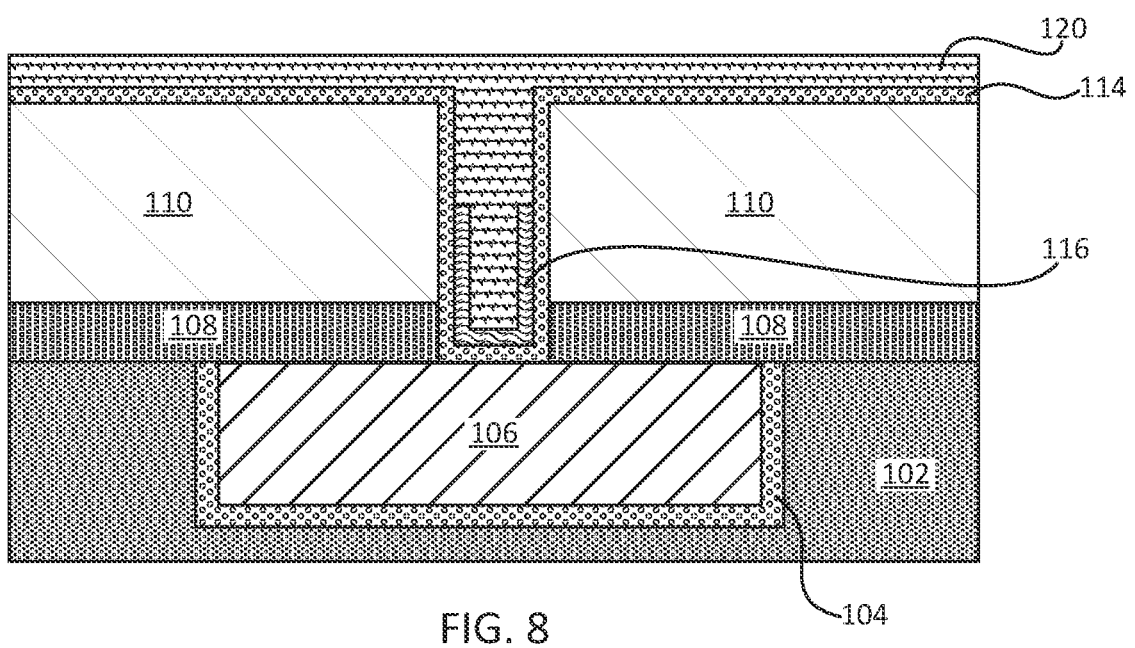
FIG. 8 is a cross-sectional view showing a conductive fill deposited in accordance with an embodiment of the present invention.

Referring to FIG. 8, a conductive deposition 120 is performed to further fill the anchor via hole 112 over the diffusion barrier 114. The conductive deposition 120 can include materials, such as, e.g., W, Mo, Ru and alloys or combinations of these and other conductive materials. In a particularly useful embodiment, the conductive deposition 120 includes W. The conductive deposition 120 is preferably formed using a CVD deposition method to ensure that the anchor via hole 112 is completely filled by the conductive deposition 118 and the conductive deposition 120 without a center seam and without any voids between the depositions. The conductive deposition 120 combines with remaining portions of conductive deposition 118 within the anchor via hole 112 to form a uniform conductive portion of the anchor via.

Figure 9:
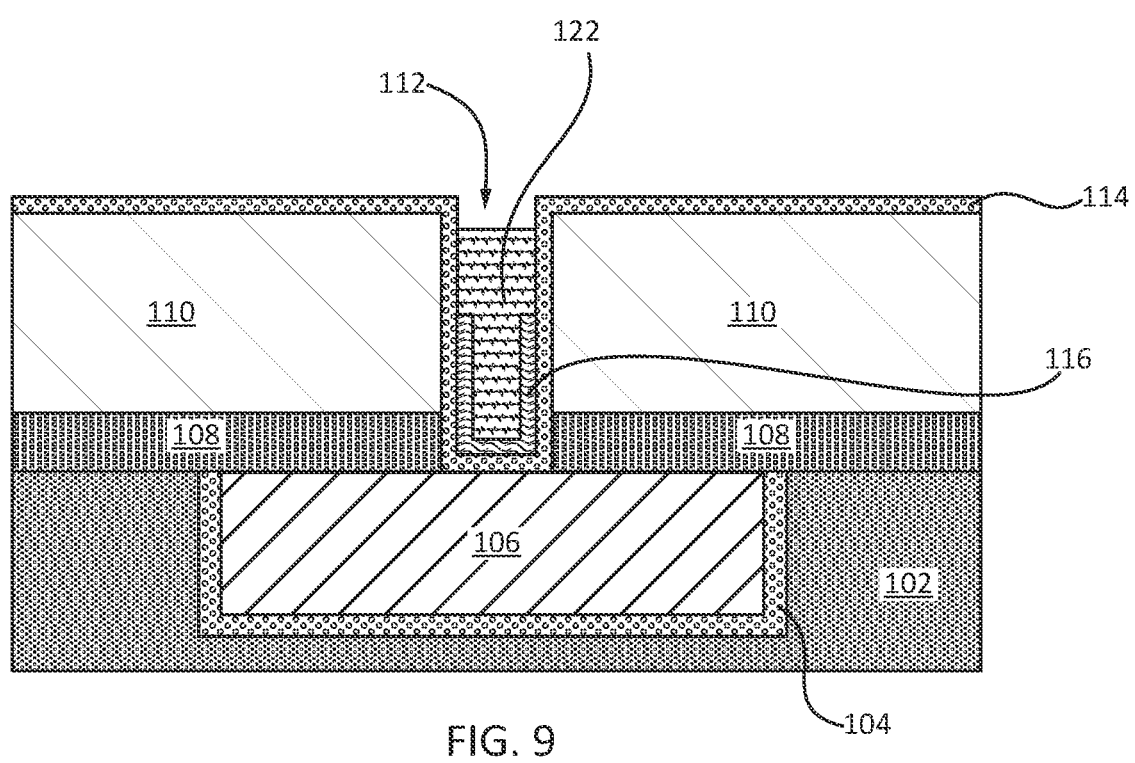
FIG. 9 is a cross-sectional view showing the conductive fill etched back providing a recess in the anchor via hole in accordance with an embodiment of the present invention.

Referring to FIG. 9, a selective etch process is performed to remove portions of the conductive deposition 120 down to the first anchor via diffusion barrier 114 and to recess the conductive deposition 120 into the anchor via hole 112. The selective etch can include a dry or wet etch that selectively removes the conductive deposition 120 such that a top surface of the conductive deposition 120 in the anchor via hole 112 remains below a surface of the dielectric layer 110 but above the second anchor via diffusion barrier 116. This forms an anchor via conductor 122.

Figure 10:
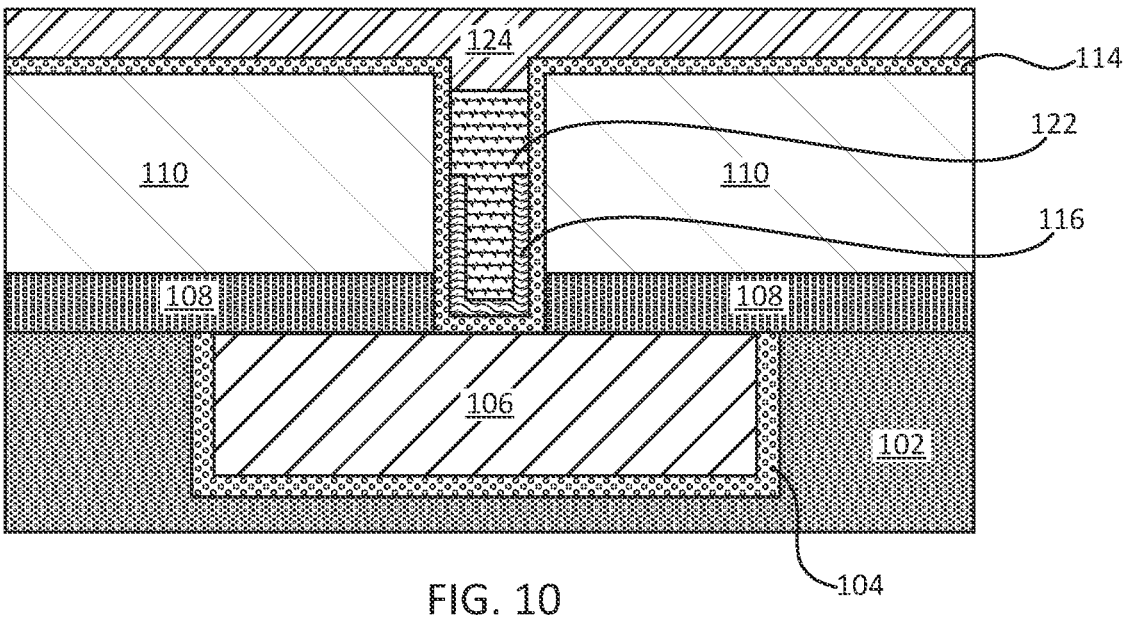
FIG. 10 is a cross-sectional view showing a cap layer formed in the recess of the conductive fill recess in the anchor via hole in accordance with an embodiment of the present invention.

Referring to FIG. 10, the anchor via hole 112 is filled and the surface of first diffusion barrier 114 is lined with a cap layer 124. The cap layer 124 can be deposited by an ALD process, PVD process or a CVD process, although other processes may be employed. The cap layer 124 can include a material such as, e.g., TiN, TaN, TiWN, TaWN, HfN or the like, although in accordance with particularly useful embodiments TaN can be employed for cap layer 124.

Figure 11:
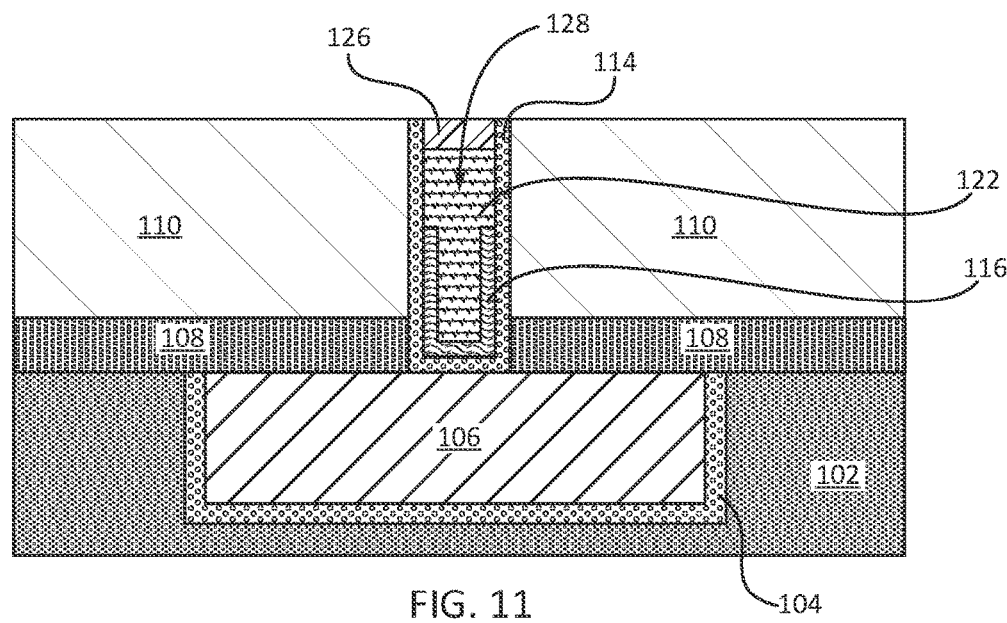
FIG. 11 is a cross-sectional view showing a conductive cap formed to complete an anchor via in accordance with an embodiment of the present invention.

Referring to FIG. 11, a planarization process is performed, e.g., CMP, to reduce the cap layer 124 to form a cap 126 in the recess of the anchor via hole 112. An anchor via 128 is now completed. The anchor via 128 is void free and there should be no metal seam since the anchor via was formed by using conformal metal deposition and metal etch processes. Conversely, if a single conformal metal deposition process had been used instead, such a conformal metal deposition process might have pinched off the space in the anchor via, resulting in the presence of voids and defects in the anchor via 128. The anchor via 128 does not include metals having magnetic properties, such as e.g., Co (so as to not interfere with magnetic materials applied in subsequent steps) or metals that diffuse easily or redistribute due to thermal budgets (e.g., Cu). The anchor via 128 should not be recessed and should share a top surface with dielectric layer 110.

Figure 12:
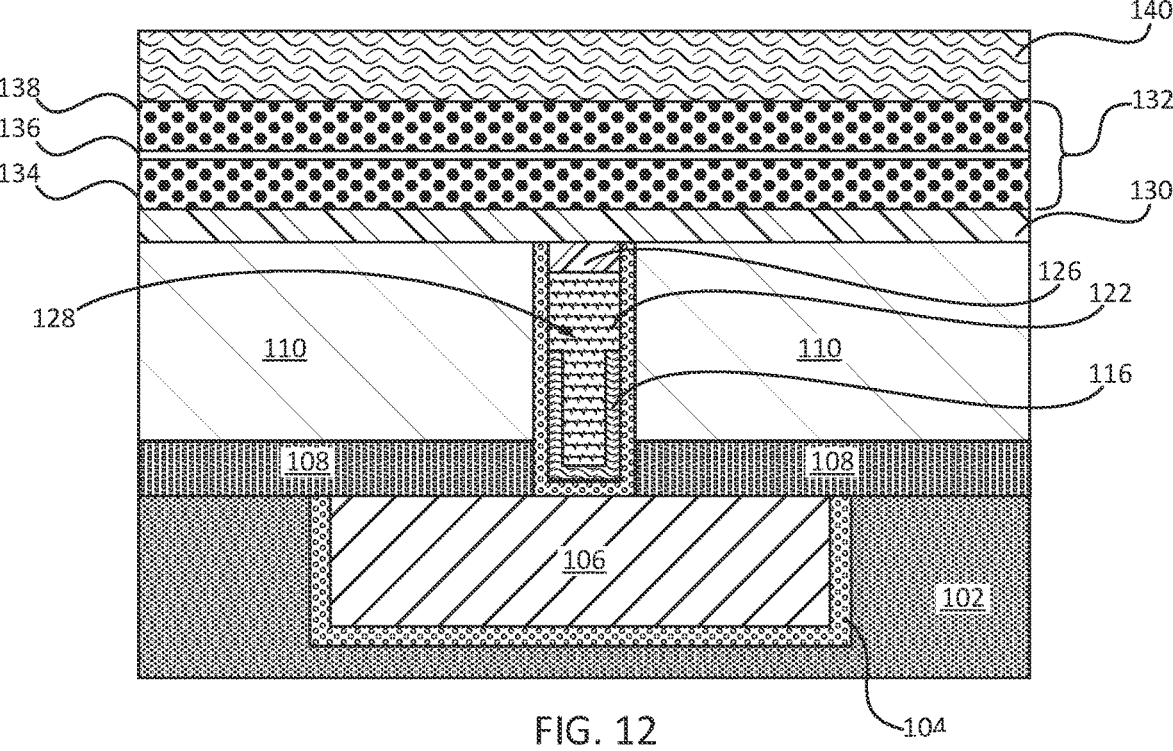
FIG. 12 is a cross-sectional view showing a magnetic tunnel junction (MTJ) layers including a bottom electrode layer, a first ferromagnetic layer, a thin dielectric layer, a second ferromagnetic layer and a top electrode layer formed in accordance with an embodiment of the present invention.

Referring to FIG. 12, a magnetoresistive random access memory (MRAM) cell includes magnetic tunnel junctions (MTJ) 132 that can be deposited in a stack and etched together to form in-plane or perpendicular magnetization of the MTJ 132. The stack of layers can include a bottom electrode 130, a ferromagnetic layer 134, a tunnel junction dielectric layer 136, a ferromagnetic layer 138 and a top electrode 140.

The bottom electrode 130 can be composed of a conductive material such as, for example, Ta, TaN, Ti, TiN, Ru, RuN, RuTa, RuTaN, Co, CoWP, CON, W or WN. The bottom electrode 130 can be formed by a conformal deposition process such as, for example, sputtering, CVD, or PECVD. The bottom electrode 130 includes a thin layer, e.g., with a thickness less than about 100 nm, and more than about 5 nm, although thickness values above 100 nm and below 5 nm are also considered.

The two ferromagnetic layers 134 and 138 are separated by a thin insulating layer 136 through which electrons can tunnel. One of the thin ferromagnetic layers 134 and 138 can be a fixed magnetization layer and the other a free magnetization layer. The ferromagnetic layers 134 and 138 can include, for example, a composition including cobalt (Co), iron (Fe), nickel (Ni), boron (B), or any combination thereof. In one example, the fixed magnetization layer can be formed of CoFeB or CoFe. In one example, the free magnetization layer can be formed of CoFeB or CoFe. Each of the fixed magnetization layer and the free magnetization layer may have a thickness ranging from about 1 nm to about 100 nm. The ferromagnetic layers 134 and 138 can be formed by a deposition process such as, for example, CVD or PECVD.

The tunnel junction dielectric layer 136 is present between ferromagnetic layers 134 and 138 and is the site of tunnel magnetoresistance (TMR), which is the magnetoresistive effect that occurs in the MTJ structure. The tunnel junction dielectric layer 136 can be formed of a non-magnetic, insulating material such as magnesium oxide (MgO), aluminum oxide ($Al_2O_3$), or titanium oxide ($TiO_2$) or any other suitable materials. The tunnel junction dielectric layer 136 may have a thickness ranging from about 1 nm to about 3 nm. The tunnel junction dielectric layer 136 can be formed by a deposition process such as, for example, CVD or ALD.

The top electrode 140 can be composed of a conductive material such as, for example, Ta, TaN, Ti, TiN, Ru, RuN, RuTa, RuTaN, Co, CoWP, CON, W, WN or any combination thereof. In one embodiment of the present application, top electrode 140 is composed of Ti/TiN. The conductive material that provides the top electrode 140 can be compositionally the same as, or compositionally different from, the conductive material that provides the bottom electrode 140 and can employ the same formation process.

Figure 13:
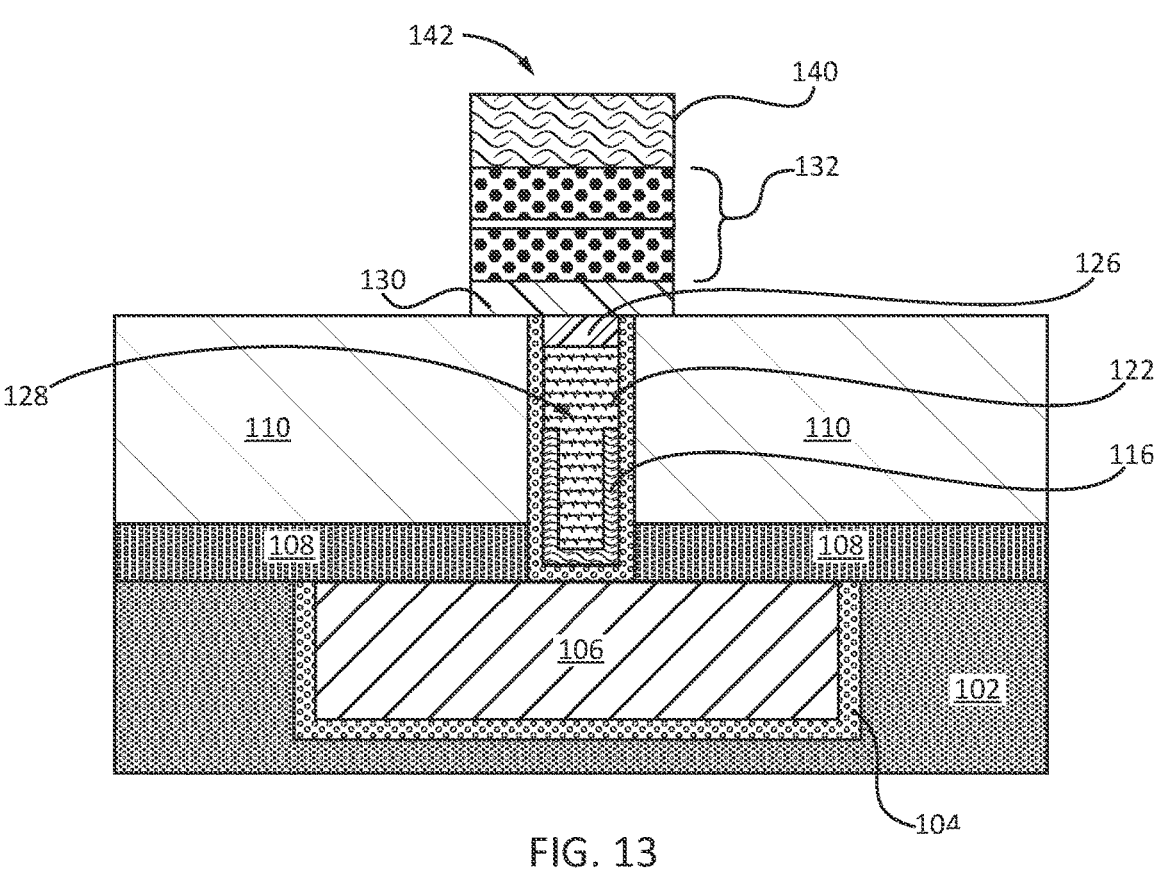
FIG. 13 is a cross-sectional view showing a MTJ stack etched from the MTJ layers in accordance with an embodiment of the present invention.

Referring to FIG. 13, a stack or stack structure 142, including the bottom electrode 130, the MTJ 132 and the top electrode 140, is formed by patterning and etching all the layers in a same sequence and using a same mask (not shown). The etching process can include dry methods, e.g., RIE, ion bean etch (IBE) or wet methods (e.g., wet HF etch).

In conventional methods, any deviation in etching processes of the layers could result in resputtering a bottom electrode or nearby metal structures due to over-etching of dielectric materials in surrounding areas which can these expose metals. The exposed metals would be sputtered onto sidewalls of the MTJ stack creating shorting issues from the redeposition of metals or conductive materials on sidewalls of the stack.

In accordance with embodiments of the present invention, the dielectric layer 110 provides a protective underlayer that ensures that no metal structure adjacent to the stack structure 142 can be exposed by over-etching. Further, the bottom electrode 130 can be maintained thin to reduce the amount of exposed conductor. The anchor via 128 is disposed within the width of the sidewalls of the stack structure 142, and along with the diminutive size of the bottom electrode 130 ensures re-sputtering of metals does not occur. In addition, there are no metal structures adjacent to the stack structure 142 above dielectric layer 108 and laterally adjacent to the anchor via 128. In this way, any etching of the stack structure 142 will not result in the resputtering of metal that could deposit on the sidewalls of the stack structure 142. Such resputtering could cause shorts, and is therefore reliably avoided in accordance with embodiments of the present invention.

Figure 14:
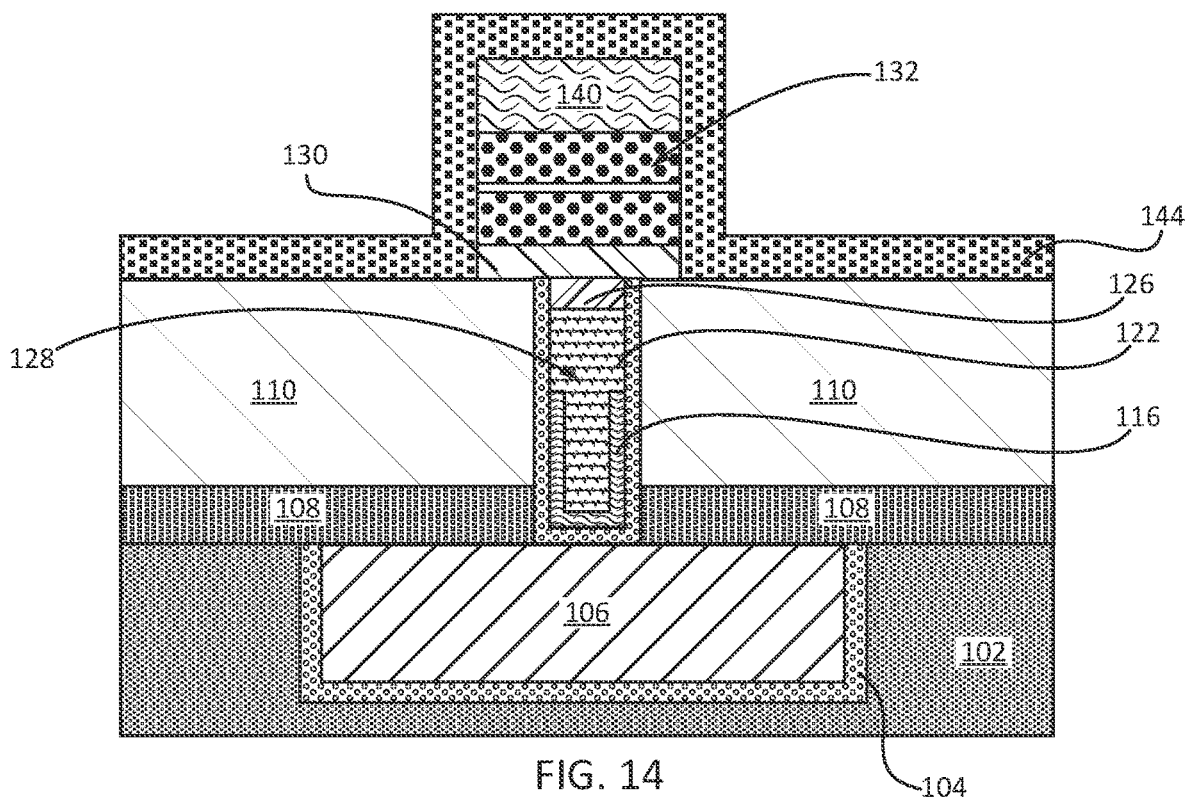
FIG. 14 is a cross-sectional view showing a spacer layer formed over the MTJ stack in accordance with an embodiment of the present invention.

Referring to FIG. 14, a dielectric encapsulation layer 144 is formed over the stack structure 142 and dielectric layer 110. The dielectric encapsulation layer 144 will be employed to form sidewall spacers in contact with the sidewalls of the stack structure 142. The dielectric encapsulation layer 144 can be formed by depositing a conformal layer of dielectric material, such as oxides, nitrides or oxynitrides. In particularly useful embodiments, the dielectric encapsulation layer 144 can include SiN, SiNC or other suitable materials. The dielectric encapsulation layer 144 can be deposited using, e.g., a CVD method.

Figure 15:
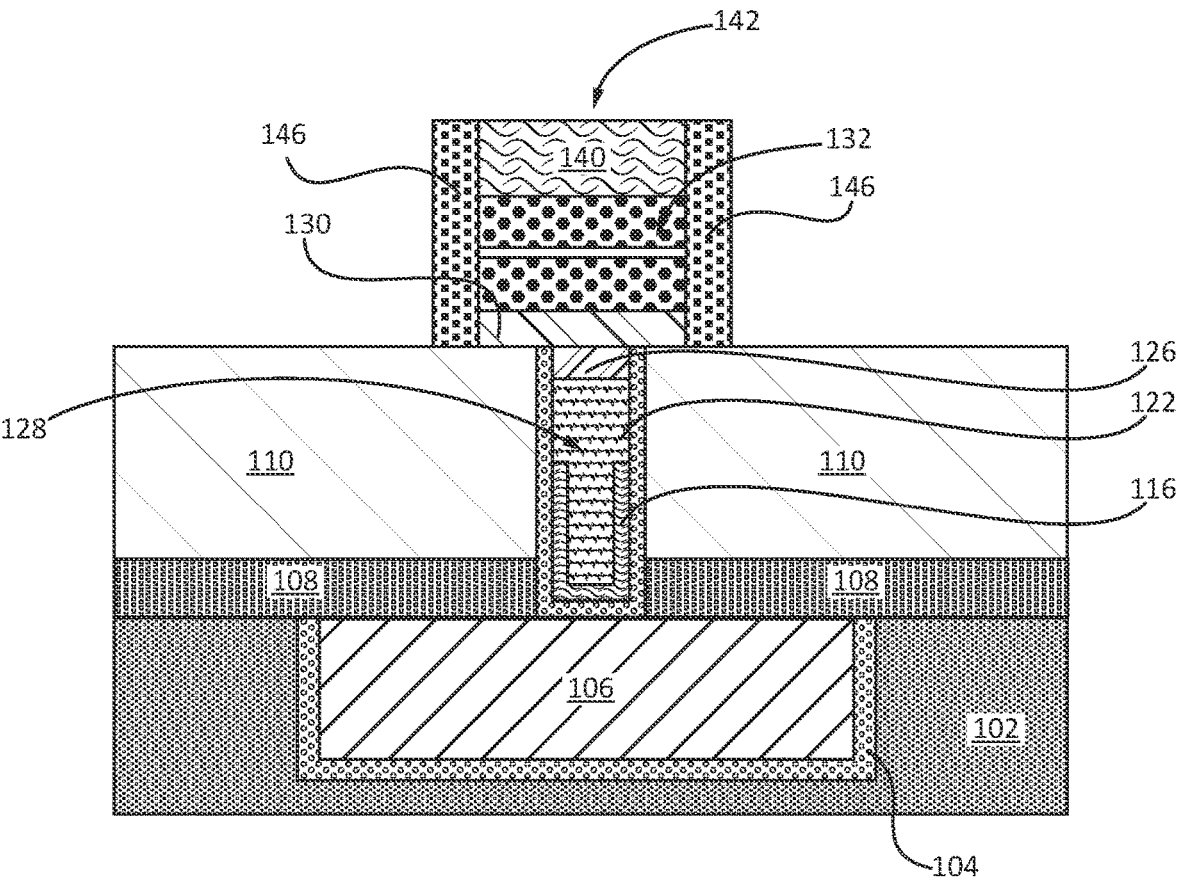
FIG. 15 is a cross-sectional view showing sidewall spacers formed on sidewalls of the MTJ stack in accordance with an embodiment of the present invention.

Referring to FIG. 15, an etch-back process is performed to remove the dielectric encapsulation layer 144 from the dielectric layer 110 and a top of the stack structure 142 (e.g., top electrode) except for the sidewalls of the stack structure 142 to form sidewall spacers 146. The sidewall spacers 146 may have a width ranging from about 1 nm to about 10 nm.

Figure 16:
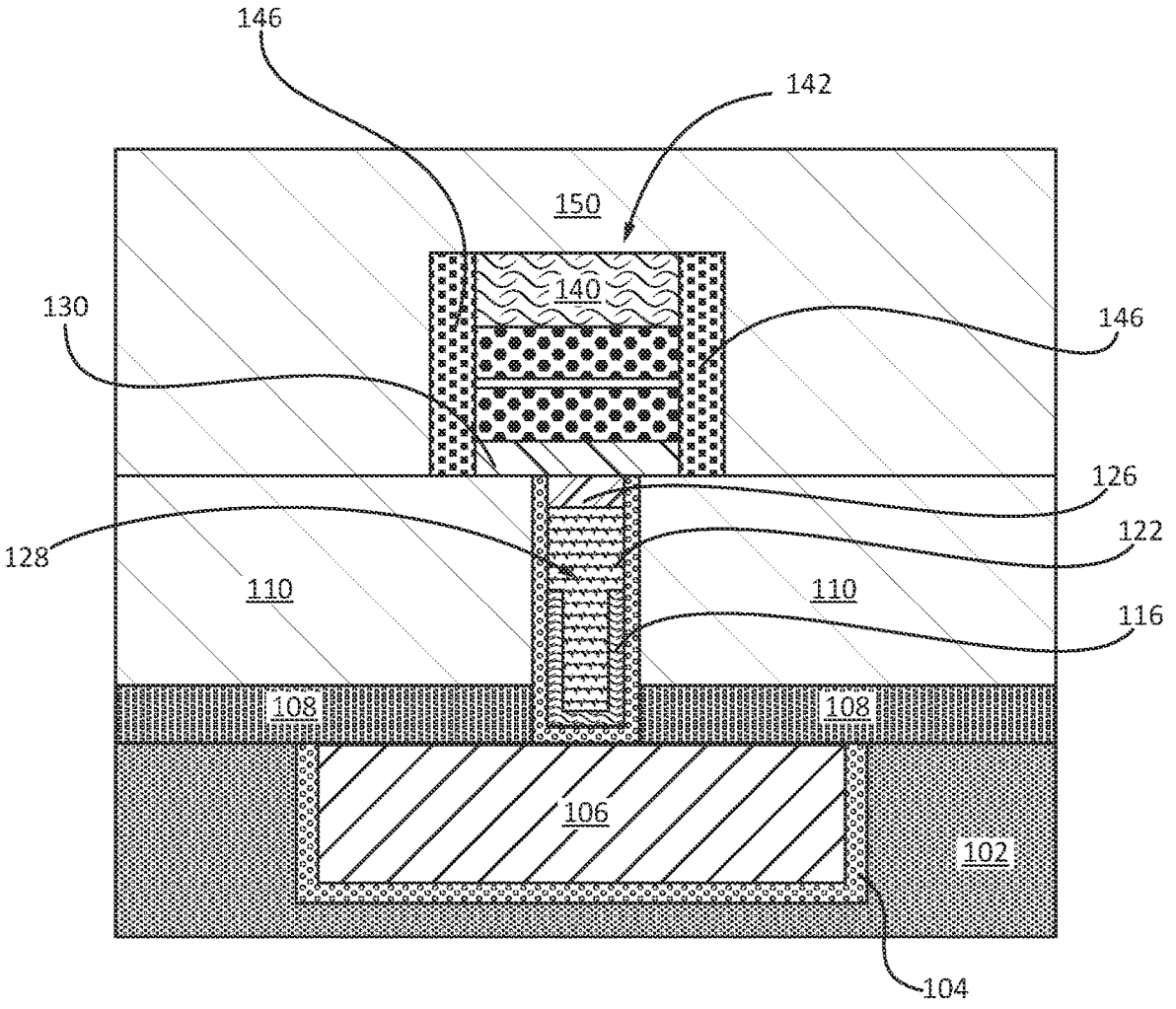
FIG. 16 is a cross-sectional view showing an interlevel dielectric layer formed over the MTJ stack in accordance with an embodiment of the present invention.

Referring to FIG. 16, a dielectric layer 150, such as, e.g., an interlevel dielectric layer (ILD) is formed with the dielectric layer 110. The dielectric layer 150 can include any suitable material and process as described for dielectric layers 102 and 110. The dielectric layer 150 can be deposited using CVD, although other deposition methods can be employed. The dielectric layer 150 is formed to cover the top electrode 140 of the stack structure 142 and provide sufficient space to form a conductor thereon.

Figure 17:
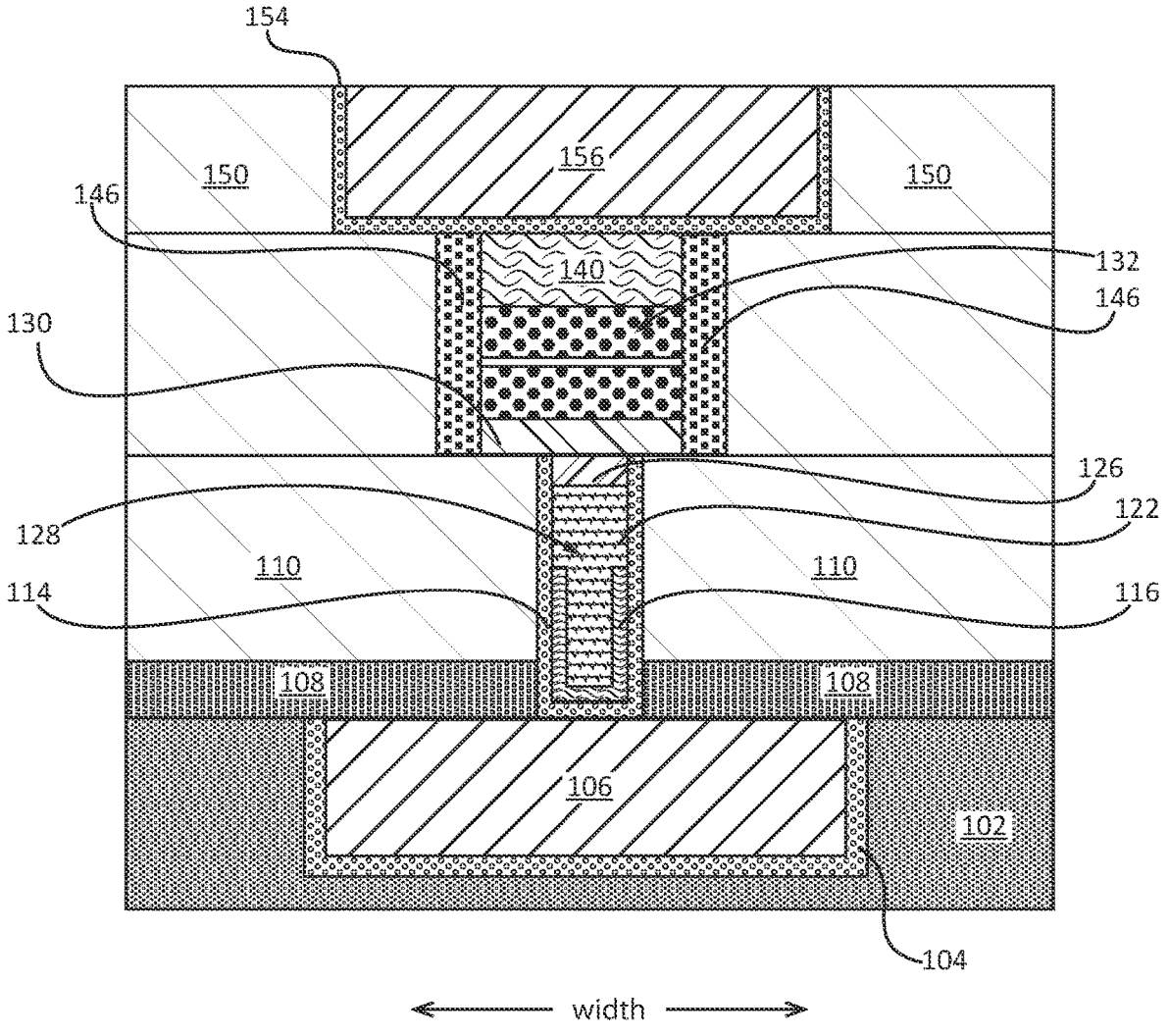
FIG. 17 is a cross-sectional view showing a conductor formed that connects to a top electrode of the MTJ stack in accordance with an embodiment of the present invention.

Referring to FIG. 17, the deposited dielectric layer 150 is then patterned and etched to form a hole or trench 152. The trench 152 is then lined with a diffusion barrier or metal liner 154. The diffusion barrier 154 can be conformally deposited over the topography of the dielectric layer 150. The diffusion barrier 154 can be deposited by an ALD process or a CVD process, although other processes may be employed. The diffusion barrier 154 can include a material such as, e.g., TiN, TaN, TiWN, TaWN, HfN or the like.

A conductive fill is performed to fill the trench on top of the diffusion barrier 154. The conductive fill can include materials, such as, e.g., Cu, Ru, Mo, Rh, W, Ir, and alloys or combinations of these and other conductive materials. In a particularly useful embodiment, the conductive fill includes Ru. The conductive fill can be formed using a deposition method, such as, e.g., CVD, PECVD, ALD or any other suitable deposition method.

A planarization process is performed, e.g., CMP to reduce the conductive fill to a surface of the dielectric layer 150 to form conductor 156. This CMP process also removes the diffusion barrier 154 from the surface of the dielectric layer 150. The conductor 156 can include a metal line, a via or any other suitable conductive structure. The conductor 106 forms another connection to a MRAM cell 160.

The MRAM cell 160 can employ spin-transfer torque (STT) phenomenon realized in the MTJ 132, wherein one ferromagnetic layer (referred to as "magnetic free layer") has a non-fixed magnetization, and the other ferromagnetic layer (referred to as a "magnetic pinned layer", or "reference layer") has a "fixed" magnetization. The MTJ 132 stores information by switching the magnetization state of the magnetic free layer. A resistance of the whole MTJ 132 changes when the magnetization of the free layer changes direction relative to that of the fixed layer, exhibiting a low resistance state when the magnetization orientation of the two ferromagnetic layers is substantially parallel and a high resistance when they are anti-parallel. Therefore, the cells have two stable states that allow the cells to serve as non-volatile memory elements.

The MRAM cells 160 are formed into arrays on a chip, which are connected by metal word and bit lines. Each memory cell 160 is connected to a word line and a bit line (e.g., conductors 106 and 156). The word lines connect rows of cells, and bit lines connect columns of cells. A selection transistor (not shown) can be electrically connected to the MTJ stack through the top electrode 140 or bottom electrode 130.

The MRAM cell 160 includes the anchor via 128 connected to the bottom electrode 130 at a base of the MTJ 132. The placement and position of the anchor via 128 assists in preventing shorts. For example, a width of the anchor via 128 is less than a width of the MTJ 132. The anchor via 128 is below the footprint of the MTJ 132 and therefore in the shadow of the MTJ 132 during etching processes. Further, the encapsulation of the anchors via's conductor 122 by diffusion barriers 114, 116 and cap 128 prevents metal diffusion into the surrounding regions of the dielectric layers 110, 150. The MTJ 132 is resistant to tunnel barrier shorts since no bottom electrode metal re-sputtering can occur during MRAM stack patterning. This is due in part to the size and location of the bottom electrode 130 and the metal-free regions adjacent to the stack in dielectric layer 110 (and dielectric layer 150) during fabrication and operation.

The FIGS. illustrate the architecture, functionality, and operation of possible implementations of devices and methods according to various embodiments of the present invention. In some alternative implementations, the functions noted may occur out of the order noted in the FIGS. For example, steps shown in succession may, in fact, be accomplished as one step, executed concurrently, substantially concurrently, in a partially or wholly temporally overlapping manner, or the steps may sometimes be executed in the reverse order, depending upon the functionality involved.

Having described preferred embodiments of devices and methods (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A magnetoresistive random access memory (MRAM), comprising:
 a first conductor;
 a magnetic tunnel junction (MTJ) having a bottom electrode; and
 an anchor via connecting the first conductor to the bottom electrode, the anchor via including a via conductor encapsulated within a diffusion barrier, the diffusion barrier including a conductive cap disposed between the via conductor and the bottom electrode, wherein the diffusion barrier includes a first diffusion barrier about sides and a bottom of the via conductor that encapsulates the via conductor along with the conductive cap and a second diffusion barrier partially lining the first diffusion barrier between the first diffusion barrier and the via conductor.

2. The MRAM as recited in claim 1, wherein the anchor via includes a width which is less than a width of the MTJ.

3. The MRAM as recited in claim 1, wherein the first conductor is disposed below a dielectric cap layer which the anchor via passes through, and regions adjacent to the anchor via and between the MTJ and the dielectric cap layer are free from metal structures.

4. The MRAM as recited in claim 1, wherein a dielectric cap layer is disposed between interlevel dielectric layers and the dielectric cap layer includes a material that is selectively etchable relative to the interlevel dielectric layers.

5. The MRAM as recited in claim 1, wherein the second diffusion barrier lining a bottom portion and lower sides of the first diffusion barrier between the first diffusion barrier and the via conductor.

6. The MRAM as recited in claim 5, wherein the first diffusion barrier and the second diffusion barrier include materials that are selectively etchable relative to each other.

* * * * *